(12) United States Patent
Wrubel et al.

(10) Patent No.: US 6,321,541 B1
(45) Date of Patent: Nov. 27, 2001

(54) MULTI-CIRCUIT MULTI-INJECTION POINT ATOMIZER

(75) Inventors: Michael P. Wrubel, Westlake; Rex J. Harvey, Mentor; Peter Laing, Geneva; Robert T. Mains, Euclid; Barry W. Savel, Andover, all of OH (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 09/361,954

(22) Filed: Jul. 27, 1999

Related U.S. Application Data

(60) Provisional application No. 60/127,993, filed on Apr. 6, 1999, and provisional application No. 60/127,307, filed on Apr. 1, 1999.

(51) Int. Cl.[7] .................................................. F02G 1/00
(52) U.S. Cl. .............................................................. 60/740
(58) Field of Search ............................. 60/740, 742, 746, 60/39.02, 39.281, 39.06

(56) References Cited

U.S. PATENT DOCUMENTS

| | | |
|---|---|---|
| 3,605,408 | 9/1971 | McGough . |
| 3,608,833 | 9/1971 | Hankins . |
| 3,612,397 | 10/1971 | Pearson . |
| 3,615,054 | 10/1971 | La Botz . |
| 3,710,574 * | 1/1973 | Pearson ................................ 60/258 |
| 3,914,348 | 10/1975 | Kors et al. . |
| 4,070,826 * | 1/1978 | Stenger et al. ...................... 60/39.66 |
| 4,081,136 | 3/1978 | Addoms et al. . |
| 4,245,769 | 1/1981 | Meginnis . |
| 4,258,544 * | 3/1981 | Gebhart et al. ...................... 60/39.32 |
| 4,292,375 | 9/1981 | Ko . |
| 4,382,534 | 5/1983 | Kwan . |
| 4,499,735 * | 2/1985 | Moore et al. ........................... 60/739 |
| 4,577,797 | 3/1986 | Raymond . |
| 4,587,700 | 5/1986 | Curbishley et al. . |
| 4,665,975 | 5/1987 | Johnston . |
| 4,735,044 * | 4/1988 | Richey et al. ........................... 60/742 |
| 4,984,732 | 1/1991 | Hudson et al. . |
| 5,038,857 | 8/1991 | Claccio . |
| 5,069,383 | 12/1991 | Cooper et al. . |
| 5,097,657 * | 3/1992 | Shekleton et al. ................. 60/39.02 |
| 5,265,793 | 11/1993 | Usui et al. . |
| 5,404,711 * | 4/1995 | Rajput ............................... 60/39.463 |
| 5,423,178 * | 6/1995 | Mains ................................. 60/39.06 |
| 5,479,705 | 1/1996 | Fowler et al. . |
| 5,484,977 | 1/1996 | Douglas . |
| 5,568,721 * | 10/1996 | Alary et al. ........................... 60/39.03 |
| 5,570,580 * | 11/1996 | Mains .................................... 60/747 |
| 5,577,386 * | 11/1996 | Alary et al. ............................ 60/742 |
| 6,076,356 * | 6/2000 | Pelletier ................................. 60/740 |
| 6,094,904 * | 8/2000 | Goodrich et al. ................... 60/39.33 |

* cited by examiner

*Primary Examiner*—Charles G. Freay
*Assistant Examiner*—W Rodriguez
(74) *Attorney, Agent, or Firm*—Christopher H. Hunter

(57) ABSTRACT

A fuel injector nozzle for dispensing fuel in the combustion chamber of a gas turbine engine, includes an elongated, multi-layered, convoluted nozzle feed strip having an internal passage for directing fuel through the length of the strip from the inlet end to an outlet end; and a cylindrical, multi-layered fuel dispensing nozzle unitary with the feed strip and fluidly connected to the outlet end of the feed strip for dispensing the fuel. The multi-layered feed strip and nozzle allows complex porting of fuel circuits through the injector. The internal fluid passages through the feed strip and nozzle are formed by etching.

38 Claims, 14 Drawing Sheets

MULTI-CIRCUIT MULTI-INJECTION POINT ATOMIZER

RELATED CASES

The present application claims priority to U.S. Provisional Application Serial No. 60/127,307; filed Apr. 1, 1999 and U.S. Provisional Application Serial No. 60/127,993; filed Apr. 6, 1999.

FIELD OF THE INVENTION

The present invention relates generally to fuel injectors, and more particularly, to fuel injectors useful for gas turbine combustion engines.

BACKGROUND OF THE INVENTION

Fuel injectors useful for such applications as gas turbine combustion engines, direct pressurized fuel from a manifold to one or more combustion chambers. Fuel injectors also function to prepare the fuel for mixing with air prior to combustion. Each injector typically has an inlet fitting connected to the manifold, a tubular extension or stem connected at one end to the fitting, and one or more spray nozzles connected to the other end of the stem for directing the fuel into the combustion chamber. A fuel passage (e.g., a tube or cylindrical passage) extends through the stem to supply the fuel from the inlet fitting to the nozzle. Appropriate valves and/or flow dividers can be provided to direct and control the flow of fuel through the nozzle. The fuel injectors are often placed in an evenly-spaced annular arrangement to dispense (spray) fuel in a uniform manner into the combustor chamber. Additional concentric and/or series combustion chambers each require their own arrangements of nozzles that can be supported separately or on common stems. The fuel provided by the injectors is mixed with air and ignited, so that the expanding gases of combustion can, for example, move rapidly across and rotate turbine blades in a gas turbine engine to power an aircraft, or in other appropriate manners in other combustion applications.

A fuel injector typically includes one or more heat shields surrounding the portion of the stem and nozzle exposed to the heat of the combustion chamber. The heat shields are considered necessary because of the high temperature within the combustion chamber during operation and after shut-down, and prevent the fuel from breaking down into solid deposits (i.e., "coking") which occurs when the wetted walls in a fuel passage exceed a maximum temperature (approximately 400° F. (200° C.) for typical jet fuel). The coke in the fuel nozzle can build up and restrict fuel flow through the fuel nozzle rendering the nozzle inefficient or unusable.

One particularly useful heat shield assembly is shown in Stotts, U.S. Pat. No. 5,598,696, owned by the assignee of the present application. This heat shield assembly includes a pair of U-shaped heat shield members secured together to form an enclosure for the stem portion of the fuel injector. At least one flexible clip member secures the heat shield members to the injector at about the midpoint of the injector stem. The upper end of the heat shield is sized to tightly receive an enlarged neck of the injector to prevent combustion gas from flowing between the heat shield members and the stem. The clip member thermally isolates the heat shield members from the injector stem. The flexibility of the clip member permits thermal expansion between the heat shield members and the stem during thermal cycling, while minimizing the mechanical stresses at the attachment points.

Another useful stem and heat shield assembly is shown in Pelletier, U.S. patent application Ser. No. 09/031,871, filed Feb. 27, 1998, and also owned by the assignee of the present application. In this heat shield assembly, the fuel tube is completely enclosed in the injector stem such that a stagnant air (dry territory) gap is provided around the tube. The fuel tube is fixedly attached at its inlet end and its outlet end to the inlet fitting and nozzle, respectively, and includes a coiled or convoluted portion which absorbs the mechanical stresses generated by differences in thermal expansion of the internal nozzle component parts and the external nozzle component parts during combustion and shut-down.

Many fuel tubes also require secondary seals (such as elastomeric seals) and/or sliding surfaces to properly seal the heat shield to the fuel tube during the extreme operating conditions occurring during thermal cycling.

While such heat shield assemblies as described above are useful in certain applications, they require a number of components, and additional manufacturing and assembly steps, which can increase the overall cost of the injector, both in terms of original purchase as well as a continuing maintenance. In addition, the heat shield assemblies can take up valuable space in and around the combustion chamber, block air flow to the combustor, and add weight to the engine. This can all be undesirable with current industry demands requiring reduced cost, smaller injector size ("envelope") and reduced weight for more efficient operation.

Because of limited fuel pressure availability and a wide range of required fuel flow, many fuel injectors include pilot and secondary nozzles, with only the pilot nozzles being used during start-up, and both nozzles being used during higher power operation. The flow to the secondary nozzles is reduced or stopped during start-up and lower power operation. Such injectors can be more efficient and cleaner-burning than single nozzle fuel injectors, as the fuel flow can be more accurately controlled and the fuel spray more accurately directed for the particular combustor requirement. The pilot and secondary nozzles can be contained within the same nozzle stem assembly or can be supported in separate nozzle assemblies. Dual nozzle fuel injectors can also be constructed to allow further control of the fuel for dual combustors, providing even greater fuel efficiency and reduction of harmful emissions.

As should be appreciated, fuel injectors with pilot and secondary nozzles require complex and sophisticated routing of the fuel to the spray orifices in the nozzle. The fuel not only has to be routed through the nozzle portion of the fuel injector, but also through the stem. Such routing becomes all the more complex in multiple nozzle arrangements, where multiple nozzles are fed along a common stem. The routing also becomes more complex if cooling circuits are included to cool the nozzle portion of the injector.

A typical technique for routing fuel through the stem portion of the fuel injector is to provide concentric passages within the stem, with the fuel being routed separately through different passages. The fuel is then directed through passages and/or annular channels in the nozzle portion of the injector to the spray orifice(s). Mains, U.S. Pat. No. 5,413,178, for example, which is also owned by the assignee of the present application, shows concentric passages where the pilot fuel stream is routed down and back along the secondary nozzle for cooling purposes. This can also require a number of components, and additional manufacturing and assembly steps, which can all be contrary to the demands of cost reduction and weight, and small injector envelope.

With current trends toward developing even more efficient and cleaner-burning combustors, it is a continuing challenge to develop improved fuel injectors to properly deliver fuel to a combustion chamber for operation of the gas turbine engine, and which will fit into a small envelope, have a reduced weight, fewer components, and can be manufactured and assembled in an economical manner.

SUMMARY OF THE PRESENT INVENTION

The present invention provides a novel and unique fuel injector for directing fuel from a manifold and dispensing the fuel within the combustion chamber of a combustion engine. The fuel injector can include multiple fuel circuits, single or multiple nozzle assemblies, and cooling circuits. The injector overall has few components for weight reduction and thereby increased fuel efficiency. The fuel injector of the present invention also fits within a small envelope and is economical to manufacture and assemble. In many applications, the fuel injector reduces the need for heat shielding around the stem of the injector, for additional reliability, weight and cost reduction. The fuel injector is particularly useful for gas turbine combustion engines on airplanes, but can also be useful in other combustion applications.

According to the present invention, the fuel injector includes an inlet fitting, a stem connected at one end to the inlet fitting, and one or more nozzle assemblies, connected to the other end of the stem and supported at or within the combustion chamber of the engine. An elongated feed strip extends through the stem to the nozzle assemblies to supply fuel from the inlet fitting to the nozzle(s) in the nozzle assemblies. The upstream end of the feed strip can be directly attached (such as by brazing or welding) to the inlet fitting without additional sealing components (such as elastomeric seals). The downstream end of the feed strip is preferably connected in a unitary (one-piece) manner to the nozzle. The feed strip has convolutions along its length to provide increased relative displacement flexibility along the axis of the stem and reduce stresses caused by differential thermal expansion due to the extreme temperatures in the combustion chamber. The need for additional heat shielding of the stem portion of the injector can therefore be reduced, if not eliminated in many applications.

The feed strip and nozzle are preferably formed from a plurality of plates. Each plate includes an elongated, feed strip portion and a unitary head (nozzle) portion, substantially perpendicular to the feed strip portion. Passages and openings in the plates are formed by selectively etching the surfaces of the plates. The plates are then arranged in surface-to-surface contact with each other and fixed together such as by brazing or diffusion bonding, to form an integral structure. Selectively etching the plates allows multiple fuel circuits, single or multiple nozzle assemblies and cooling circuits to be easily provided in the injector. The etching process also allows multiple fuel paths and cooling circuits to be created in a relatively small cross-section, thereby reducing the size of the injector.

The feed strip portion of the plate assembly is then mechanically formed (bent) to provide the convoluted form. In one form of the invention the plates all have a T-shape in plan view. In this form, the head portions of the plate assembly can be mechanically formed (bent) into a cylinder, or other appropriate shape. The ends of the head can be spaced apart from one another, or can be brought together and joined, such as by brazing or welding. Spray orifices are provided on the radially outer surface, radially inner surface and/or ends of the cylindrical nozzle to direct fuel radially outward, radially inward and/or axially from the nozzle. The integral feed strip and nozzle unit requires only a small envelope, is economical to manufacture and assemble, and it is believed will have reduced maintenance and service costs over time.

Thus, as described above, a novel and unique fuel injector for combustion engines is provided which directs fuel from a manifold to a combustion chamber. The fuel injector is economical to manufacture and assemble, and can be incorporated into a small envelope. The injector has few components for weight reduction, which thereby increases the fuel efficiency of the engine.

Further features and advantages of the present invention will become apparent to those skilled in the art upon reviewing the following specification and attached drawings.

BRIEF DESCRIPTION OF THE DRAWINGS

FIG. 11 is a cross-sectional end view of the fuel injector taken substantially along the plane described by the lines 11—11 of FIG. 3.

DETAILED DESCRIPTION OF THE PREFERRED EMBODIMENT

Figure 1:
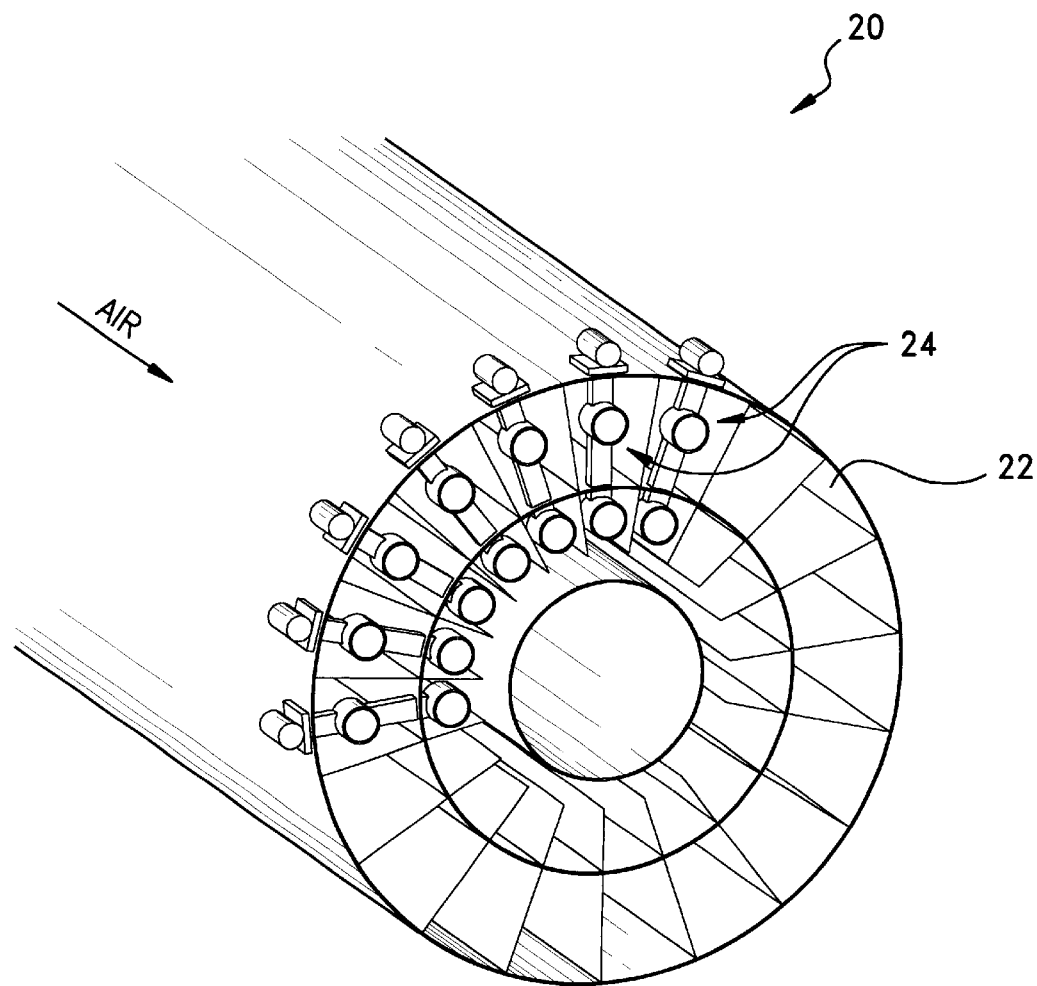
FIG. 1 is an elevated perspective view of the inlet into a dual concentric combustion chamber for a gas turbine engine, showing a plurality of fuel injection nozzles constructed according to the principles of the present invention.

Referring to the drawings and initially to FIG. 1, a portion of a combustion engine is indicated generally at 20. The upstream, front wall of a dual combustion chamber for the engine is shown at 22, and a plurality of fuel injectors, for example as indicated generally at 24, are shown supported within the combustion chamber. The fuel injectors 24 atomize and direct fuel into the combustion chamber 22 for burning. Combustion chamber 22 can be any useful type of combustion chamber, such as a combustion chamber for a gas turbine combustion engine of an aircraft, however, the present invention is believed useful for combustion chambers for any type of combustion application. In any case, the combustion chamber will not be described herein for sake of brevity, with the exception that as should be known to those skilled in the art, air at elevated temperatures (up to 1300° F. in the combustion chamber of an aircraft), is directed into the combustion chamber to allow combustion of the fuel.

As illustrated in FIG. 1, a dual nozzle arrangement for each injector is shown, where each of the fuel injectors 24 includes two nozzle assemblies for directing fuel into radially inner and outer zones of the combustion chamber. It should be noted that this multiple nozzle arrangement is only provided for exemplary purposes, and the present invention is useful with a single nozzle assembly, as well injectors having more than two nozzle assemblies in a concentric or series configuration. It should also be noted that while a number of such injectors are shown in an evenly-spaced annular arrangement, then number and location of such injectors can vary, depending upon the particular application. One of the advantages of the present invention it is that is useful with a variety of different injector configurations.

Figure 2:
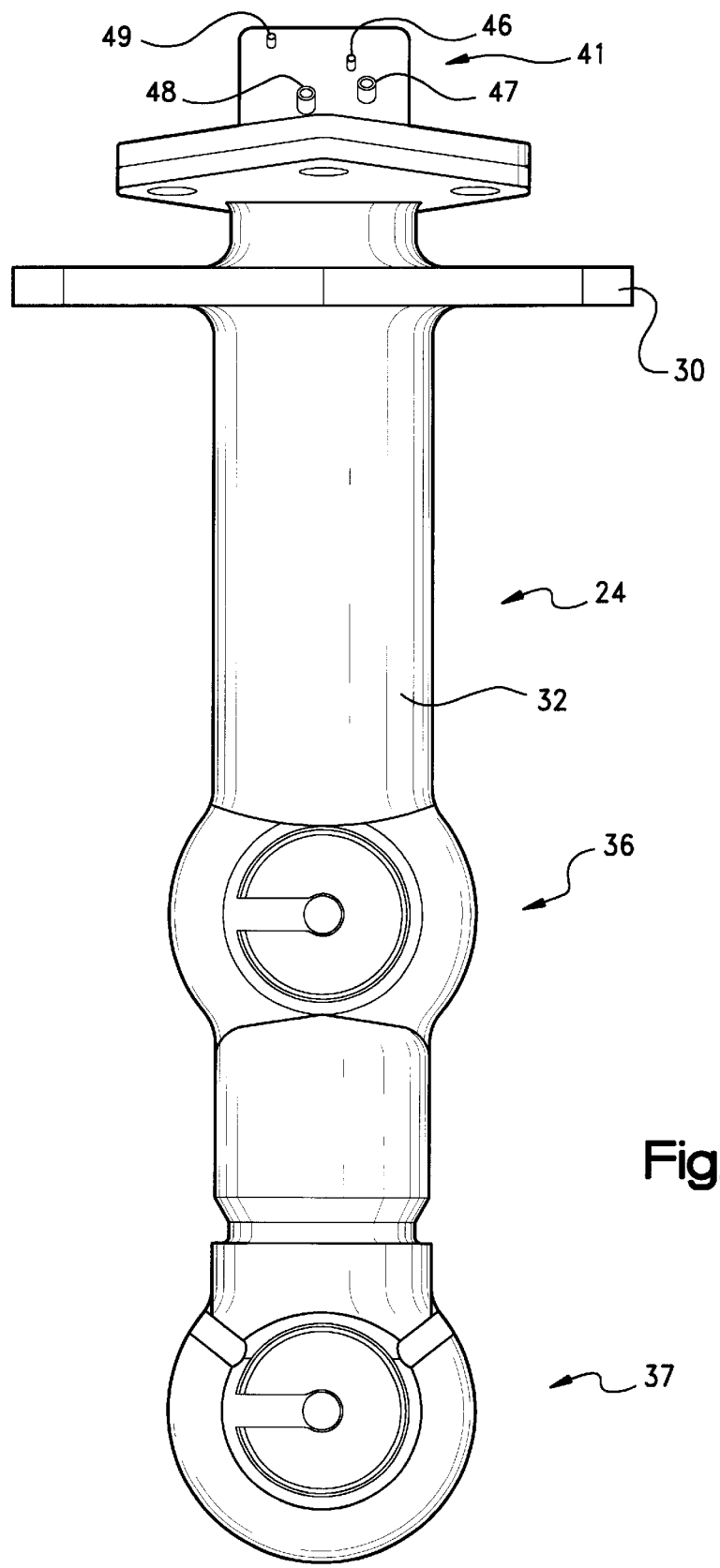
FIG. 2 is an elevated perspective view of a fuel injector for the engine of FIG. 1.
Figure 3:
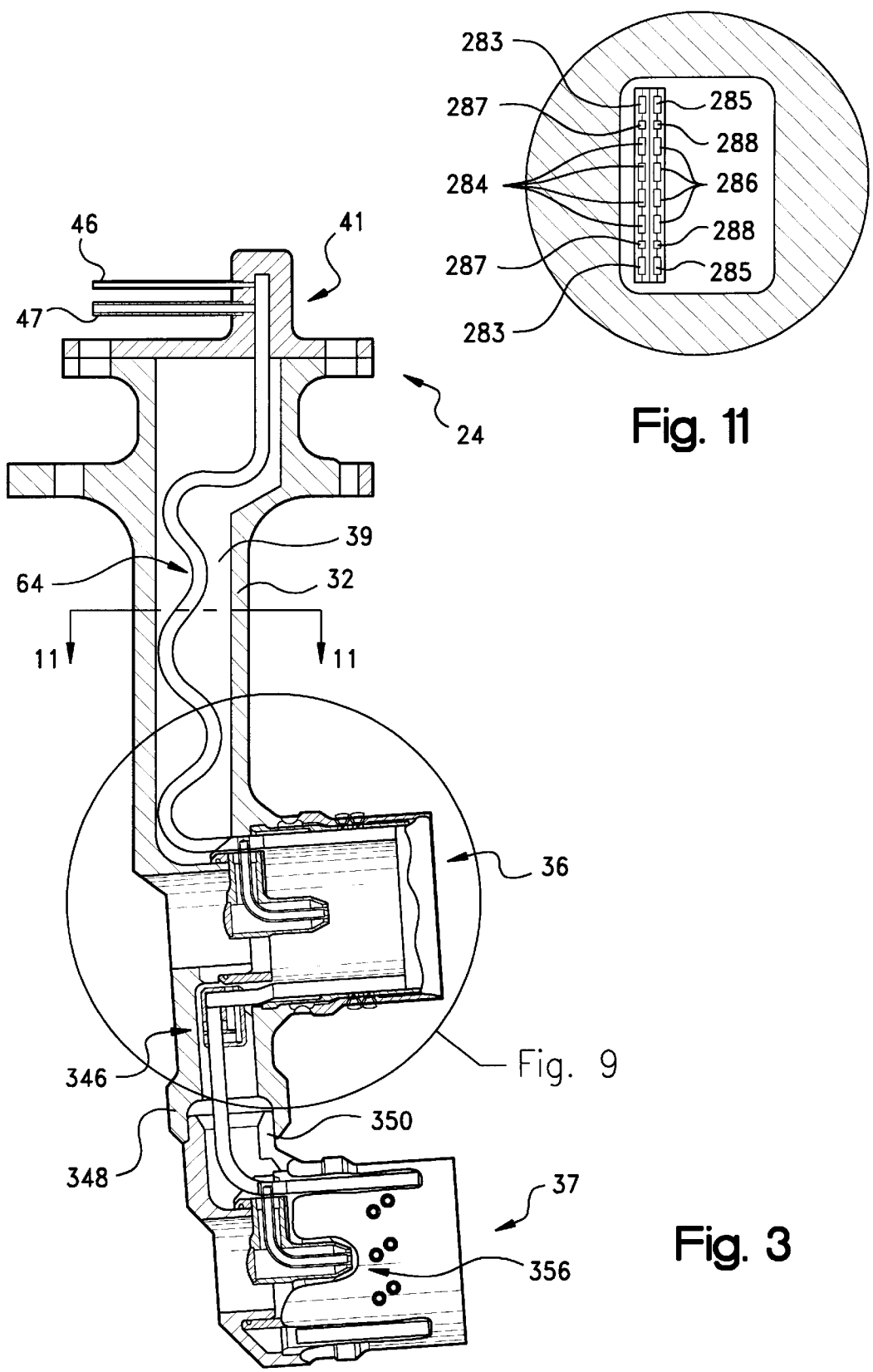
FIG. 3 is a cross-sectional side view of the fuel injector of FIG. 2.

The fuel injectors 24 are typically identical. Referring now to FIGS. 2 and 3, each fuel injector 24 includes a nozzle mount or flange 30 adapted to be fixed and sealed to the wall of the combustor casing (such as with appropriate fasteners); a housing stem 32 integral or fixed to flange 30 (such as by brazing or welding); and one or more nozzle assemblies such as at 36, 37, supported on stem 32. Stem 32 includes an open inner chamber 39. The various components of the fuel injector 24 are preferably formed from material appropriate for the particular application as should be known to those skilled in the art.

An inlet assembly, indicated generally at 41, is disposed above or within the open upper end of chamber 39, and is integral with or fixed to flange 30 such as by brazing. Inlet assembly 41 is also formed from material appropriate for the particular application and includes inlet ports 46–49 which are designed to fluidly connect with the fuel manifold (not shown) to direct fuel into the injector 24.

Figure 4:
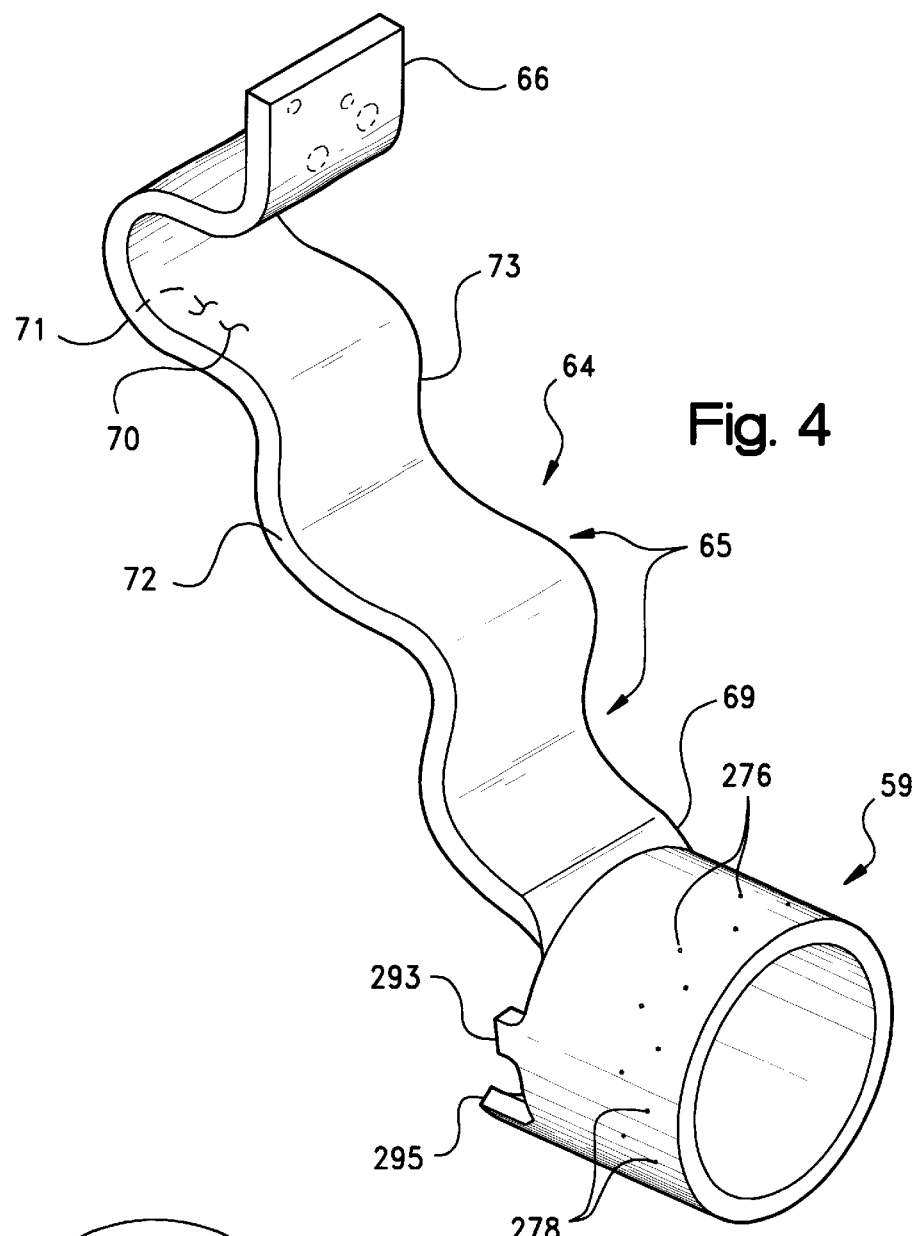
FIG. 4 is an elevated perspective view of a first integral fuel feed strip and nozzle unit for the fuel injector of FIG. 2.
Figure 9:
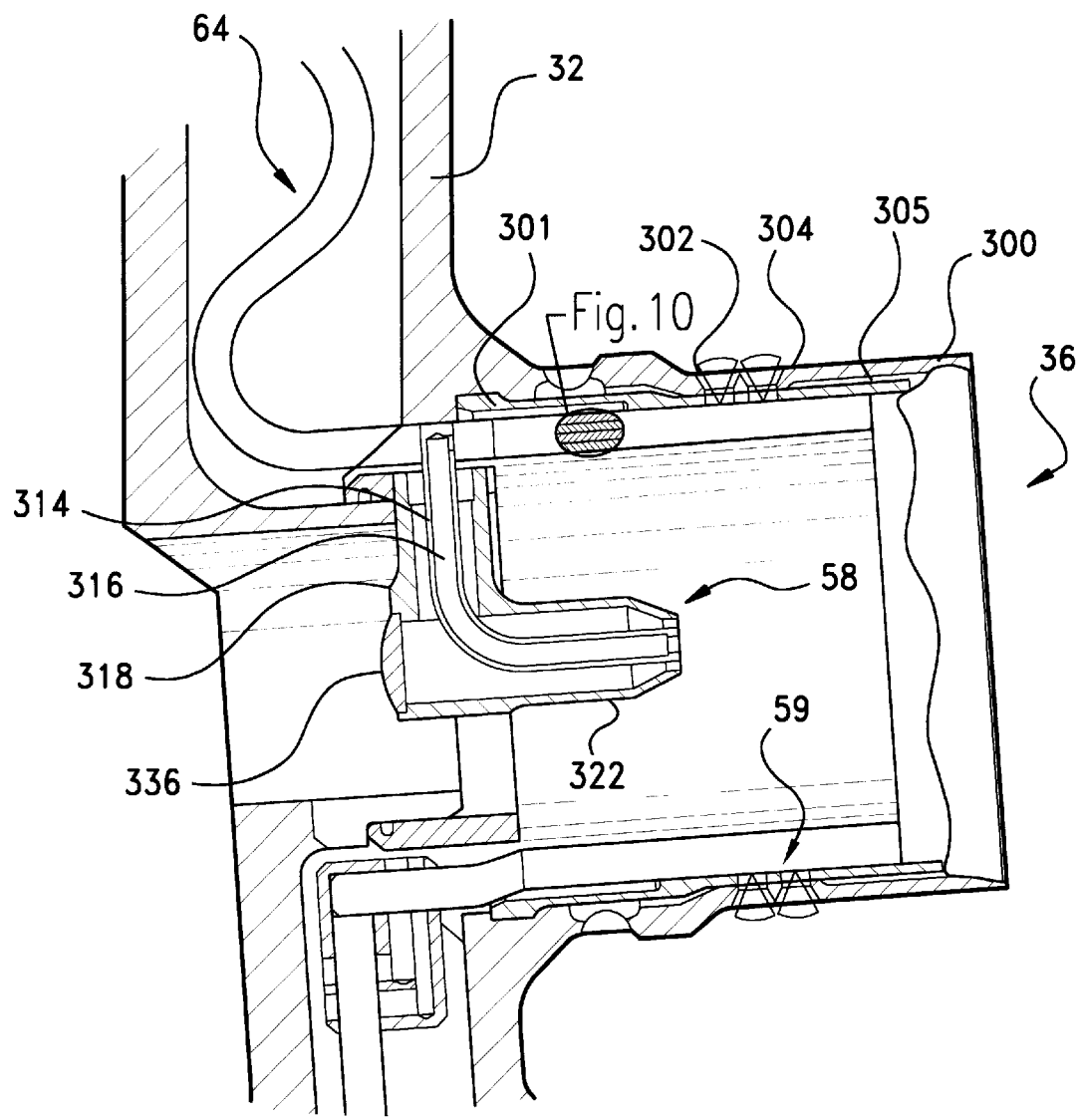
FIG. 9 is an enlarged cross-sectional side view of a portion of the fuel injector of FIG. 3.

Referring now to FIGS. 3, 4 and 9, each of the nozzle assemblies 36, 37 is illustrated as including a pilot nozzle, indicated generally at 58, and a secondary nozzle, indicated generally at 59. Both nozzles 58, 59 are generally used during normal and extreme power situations, while only pilot nozzle 58 is generally used during start-up. Again, a pilot and secondary nozzle configuration is shown only for exemplary purposes, and it is within the scope of the present invention to provide only a single nozzle for each nozzle assembly 36, 37, or for more than two nozzles for each nozzle assembly.

An elongated feed strip, indicated generally at 64, provides fuel from inlet assembly 41 to nozzle assemblies 36, 37. Feed strip 64 is an expandable feed strip formed from a material which can be exposed to combustor temperatures in the combustion chamber without being adversely affected. To this end, feed strip 64 has a convoluted (or tortuous) shape, and includes at least one, and preferably a plurality of laterally-extending, regular or irregular bends or waves as at 65, along the longitudinal length of the strip from inlet end 66 to outlet end 69. The convoluted shape allows expansion and contraction of the feed strip in response to thermal changes in the combustion chamber while reducing mechanical stresses within the injector. The convoluted feed strip thereby eliminates the need for additional heat shielding of the steam portion in many applications, although in some high-temperature situations an additional heat shield may still be necessary or desirable.

By the term "strip", it is meant that the feed strip has an elongated, essentially flat shape, where the side surfaces 70, 71 of the strip are essentially parallel, and oppositely facing from each other; and the essentially perpendicular edges 72, 73 of the strip are also essentially parallel and oppositely-facing. The strip has essentially a rectangular shape in cross-section (as compared to the cylindrical shape of a typical fuel tube), although this shape could vary slightly depending upon manufacturing requirements and techniques. It is preferred that the feed strip have enough convolutions along the length of the strip to allow the strip to easily absorb thermal changes within the combustion chamber without providing undue stress on inlet assembly 41 and nozzle 59. The strip should not have too many convolutions, however, as the strip may then exhibit resonant behavior in the combustion system. It is believed that the number and configuration of the convolutions appropriate for the particular application can be easily determined by simple experimentation, including analytical modeling and/or resonant frequency testing.

The strip 64 is shown as having its side surfaces substantially perpendicular to the direction of air flow through the combustion chamber. This may block some air flow through the combustor, and in appropriate applications, the strip may be aligned in the direction of air flow.

Feed strip 64 includes a plurality of inlet ports, where each port fluidly connects with inlet ports 46–49 in inlet assembly 41 to direct fuel into the feed strip. The inlet ports feed multiple fuel paths down the length of the strip to pilot nozzles 58 and secondary nozzles 59 in both nozzle assemblies 36, 37, as well as provide cooling circuits for thermal control in both nozzle assemblies. For ease of manufacture and assembly, the feed strip 64 and secondary nozzle 59 are integrally connected to each other, and preferably formed unitarily with one another, to define a fuel feed strip and nozzle unit.

Figure 10:
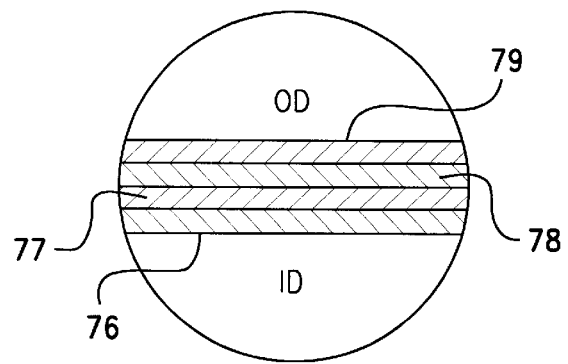
FIG. 10 is an enlarged cross-sectional side view of a portion of the fuel feed and injection unit of the fuel injector.

Referring now to FIGS. 5A–8B, the feed strip 64 and secondary nozzle 59 are preferably formed from relatively thin (e.g., 0.005–0.090 inches thick), flat, plates 76–79 which are located in adjacent, surface-to-surface contact with each other (see FIG. 10); with plate 76 being the innermost plate, and plate 79 being the outermost plate. The plates are each preferably formed in one piece from a metal sheet of an appropriate material such as INCONEL 600, and can be formed in the required configuration (such as the illustrated T-shape configuration) by durable etching, stamping or die-cutting. While four plates are illustrated and described, it is of course possible that a greater or lesser number of plates could be provided, and that the shape of the individual plates may be other than as illustrated, for example, the plates could all be simply in the form of a strip. It is also possible that the feed strip 64 and secondary nozzle 59 could be formed separately and then later attached together. However, to reduce the number of individual components and manufacturing and assembly steps, it is preferred that these components be formed together (unitarily) from one-piece plates.

Figure 5A:
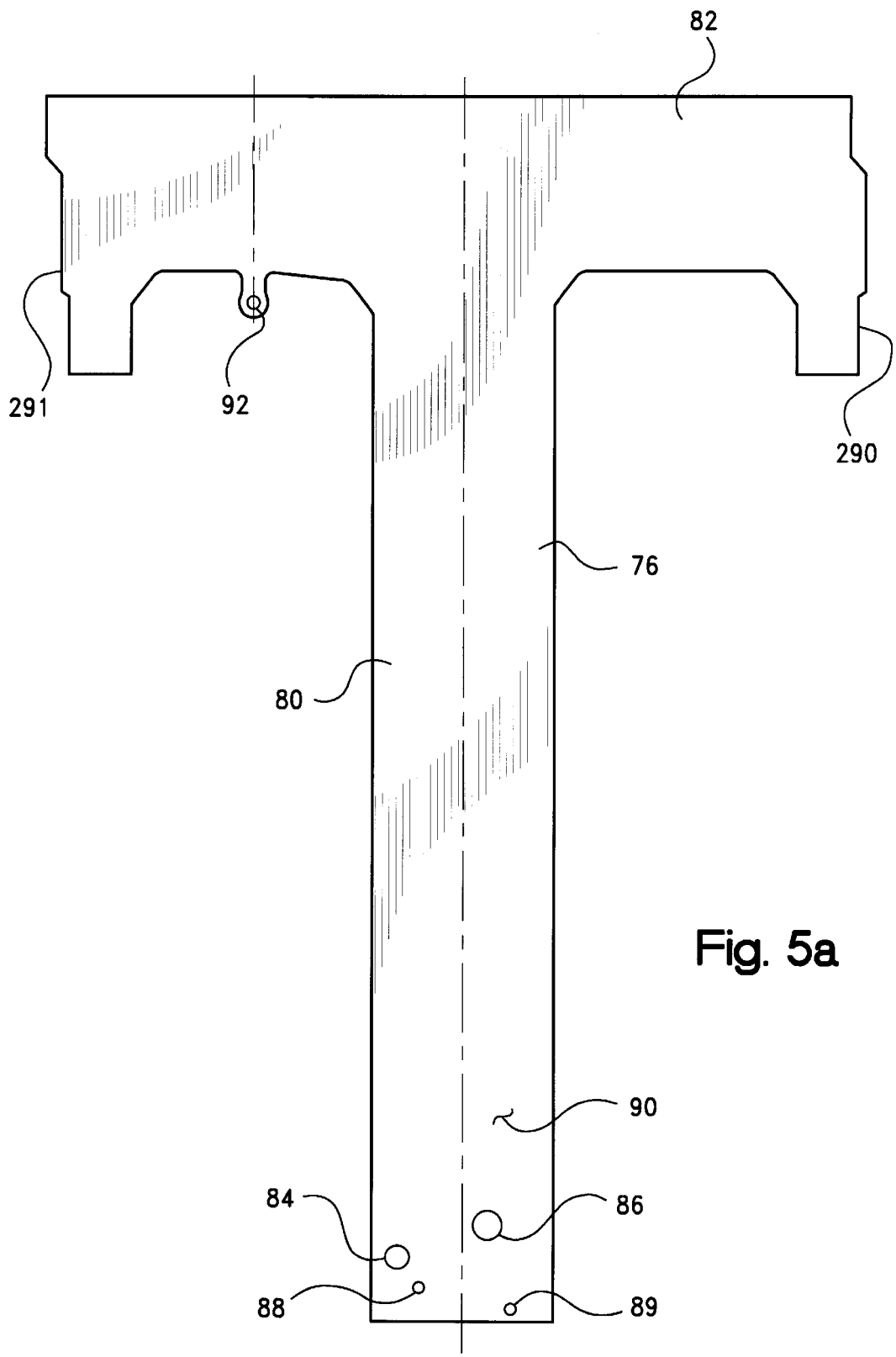
FIG. 5A is a plan view of the inner surface of a first plate for the fuel feed and injection unit of FIG. 4.
Figure 5B:
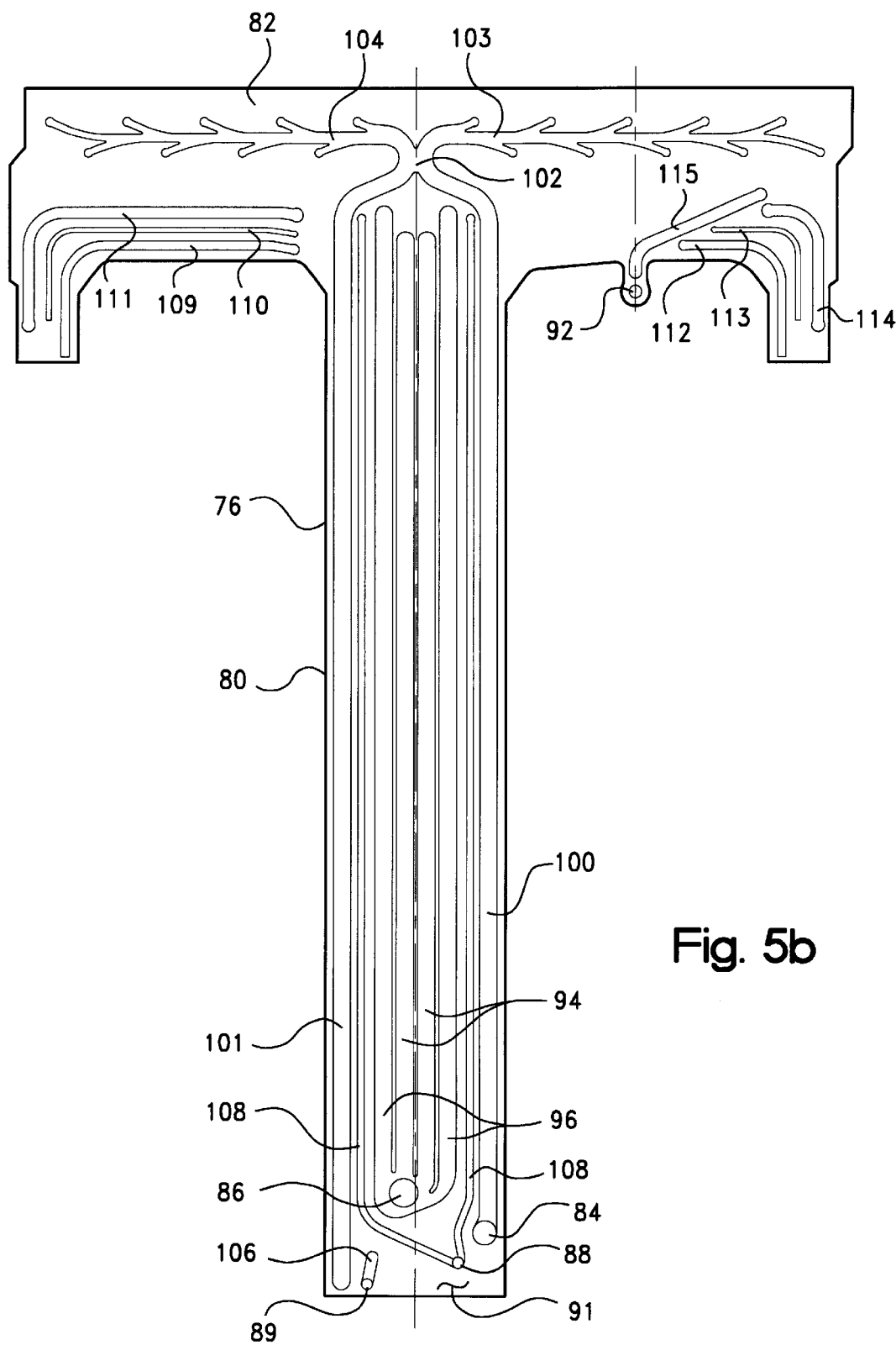
FIG. 5B is a plan view of the outer surface of the plate of FIG. 5A.

As shown in FIGS. 5A and 5B, the first plate 76 has a longitudinally-extending feed portion 80 and a head nozzle portion 82, extending substantially perpendicular to the feed portion 80. An inlet opening 84 is provided for a first fuel circuit to the secondary nozzle 59 in both nozzle assemblies 36, 37; and an inlet opening 86 is provided for a second fuel circuit to the secondary nozzle 59 in both nozzle assemblies 36, 37. An inlet opening 88 is provided for the first pilot nozzle 58 in nozzle assembly 36; while an inlet opening 89 is provided for the second pilot nozzle in the nozzle assembly 37. An outlet opening 92 in head 82 is provided for fluid connection to the pilot nozzle 58 in the nozzle assembly 36.

Openings 84–89 extend from the inner surface 90 to the outer surface 91 of plate 76 to fuel passages extending longitudinally through feed portion 80 toward head 82 on the outer surface 91 (see FIG. 5B). Specifically, inlet opening 86 is fluidly connected to passages 94 and 96, while inlet opening 84 is fluidly connected to passages 100, 101. Passages 100, 101 are fluidly connected together by a short passage 102. Passages 100, 101 fluidly connect to outwardly-projecting distribution passages 103, 104, extending outwardly along head portion 82.

Pilot inlet opening 89 is fluidly connected to a short flow passage 106; while pilot opening 88 is connected to flow passages 108 extending along the length of feed portion 80. Surface 91 of plate 76 further includes partial flow passages 109–115.

Figure 6A:
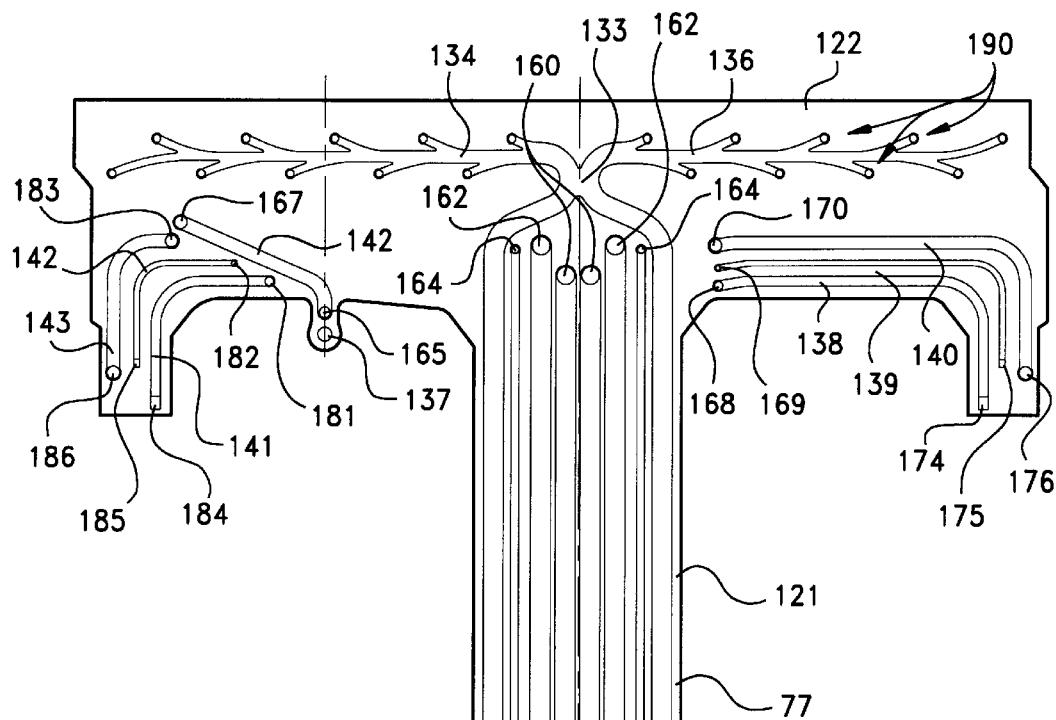
FIG. 6A is a plan view of the inner surface of a second plate for the unit of FIG. 4.
Figure 6B:
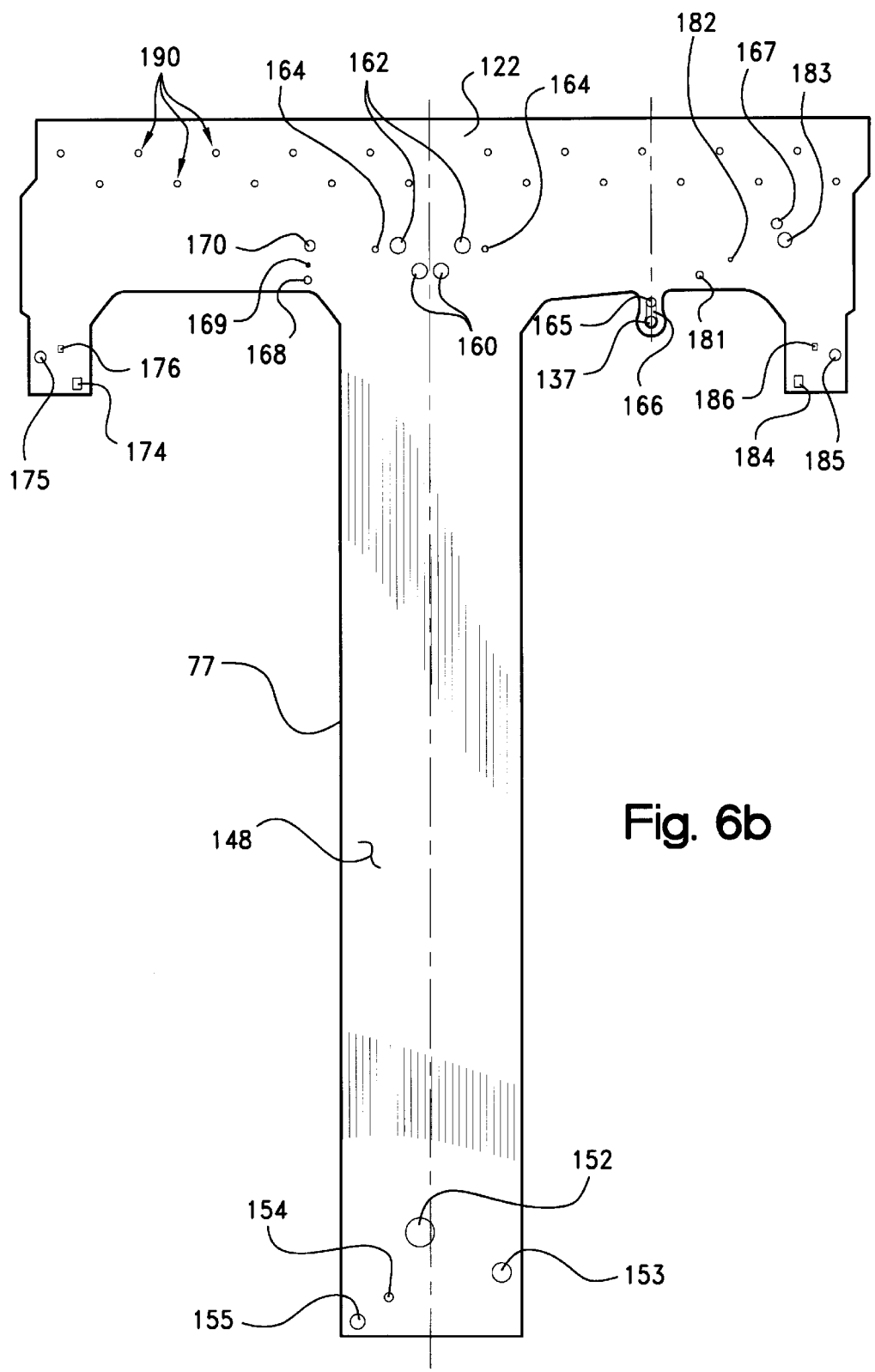
FIG. 6B is a plan view of the outer surface of the plate of FIG. 6A.

Referring now to FIG. 6A, plate 77 has an inner surface 120 which is located in adjacent, surface-to-surface contact with outer surface 91 of plate 76. Plate 77 has substantially the same configuration as plate 76, and includes a longitudinally-extending feed strip portion 121, and a head (nozzle) portion 122, substantially perpendicular to feed strip portion 121. Inner surface 120 of plate 77 has a similar flow path configuration as surface 80 of plate 76, including flow passages 124 and 126 aligned with flow passages 94 and 96, respectively, in plate 76; flow passages 128–129 aligned with flow passages 100, 101, respectively, in plate 76; flow passage 130 aligned with flow passage 106 in plate 76; and flow passages 132 aligned with flow passages 108 in plate 76. A short flow passage 133 fluidly interconnects passages 128 and 129. Flow passages 128 and 129 extend longitudinally to outward-projecting distribution passages 134, 136 in the head portion 122 of plate 77, which are aligned with distribution passages 103, 104, respectively, in plate 76. An opening 137 is also provided in alignment with opening 92 in plate 76. Plate 77 further includes partial flow passages 138–140 which are aligned with flow passages 109–111, respectively in plate 76; and partial flow passages 141–143 which are aligned with partial flow passages 112–114 in plate 76. A flow passage 142 is aligned with flow passage 115 in plate 76.

The outer surface 148 (FIG. 6B) of plate 77 includes openings 152–155 which fluidly connect with passages 124, 126, 128, 130 and 129 (FIG. 6A). Plate 77 further includes openings 160 fluidly connected to passages 126; openings 162 fluidly connected to passages 124; and openings 164 fluidly connected to passages 132. Opening 165 is fluidly connected to one end of partial flow passage 142. A passage 166 fluidly connects opening 137 with opening 165. Plate 77 further includes openings 168–170 fluidly connected to one end of partial passages 138–140, respectively. An opening 167 is provided to fluidly connect to one end of partial passage 142. Openings 174–176 are connected to the other end of partial passages 138–140, respectively.

Openings 181–183 are also provided which are fluidly connected to the other end of partial flow passages 141–143, respectively. Openings 184–186 are fluidly connected to the other end of partial flow passages 141–143, respectively.

A series of circular distribution chambers, as indicated generally at 190, fluidly connect with flow distribution pathways 134 and 136.

Figure 7A:
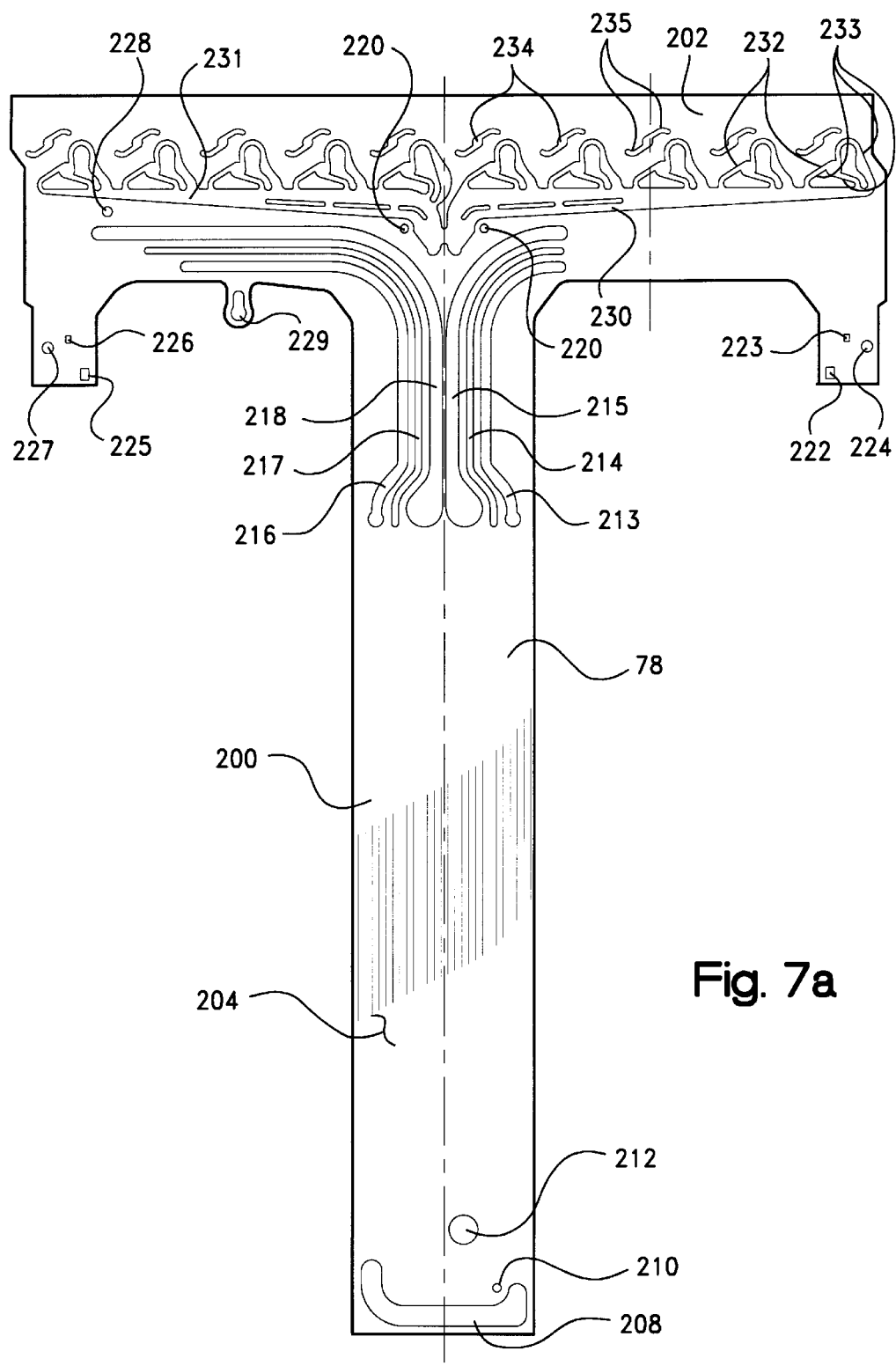
FIG. 7A is a plan view of the inner surface of a third plate for the unit of FIG. 4.
Figure 7B:
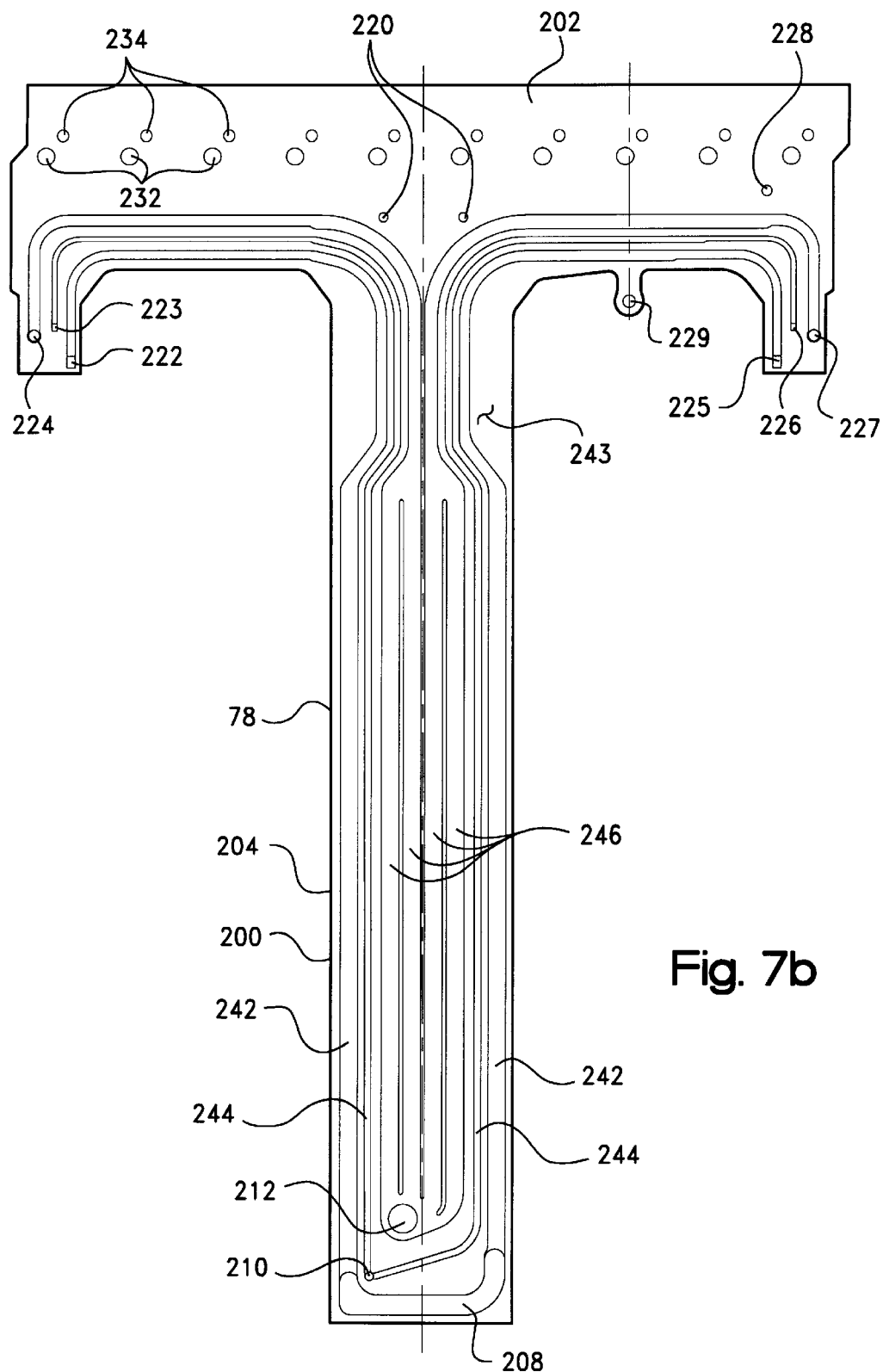
FIG. 7B is a plan view of the outer surface of the plate of FIG. 7A.

Referring now to FIGS. 7A and 7B, plate 78 is shown as also having a similar configuration in plan view, with a longitudinally-extending feed strip portion 200 and a head (nozzle) portion 202, extending substantially perpendicular to feed portion 200.

The inner surface 204 of plate 78 (FIG. 7A) is disposed in surface-to-surface contact with the outer surface 148 of plate 77. Inner surface 204 includes an opening 208 which fluidly connects openings 153 and 155 in plate 77. Opening 208 provides fluid communication between openings 153 and 155 in plate 77, such that flow is provided along both branches of passages 100, 101 (FIG. 5B). An opening 210 is also provided in alignment with opening 154 in plate 77; and an opening 212 is provided in alignment with opening 152 in plate 77. Partial flow passages 213–215 are provided in fluid communication with openings 168–170, respectively, in plate 77. Partial flow passages 216–218 are provided in fluid communication with openings 181–183, respectively in plate 77. Openings 220 are provided in alignment with openings 164 in plate 77. Openings 222–224 are also provided in alignment with openings 174–176, respectively, in plate 77; while openings 225–227 are provided in alignment with openings 184–186, respectively, in plate 77. Opening 228 is provided in alignment with opening 167 in plate 77. Opening 229 is in alignment with opening 137 in plate 77. Distribution passages 230, 231, project outward along head 202, and are in fluid communication with openings 160, 162 in plate 77.

Distribution flow passages 230, 231 feed a plurality of swirl chambers, such as at 232, through non-radial feed passages, such as at 233. Three non-radial feed passages 233 are provided for each swirl chamber 232, and provide a vortex swirl to fuel flowing into the swirl chambers 232. The distribution passages 230, 231 have a tapered configuration to ensure the even distribution of fuel to all of the feed passages 233 and swirl chambers 232.

Plate 78 similarly includes swirl chambers as at 234, which are in fluid communication with openings 190 in plate 77. Nonradial flow passages 235 provide a vortex swirl to fuel flowing into the swirl chambers 234. Two non-radial passages 235 are provided for each swirl chamber 234. Openings 190 in plate 77 feed fuel to the non-radial flow passages 235.

As shown in FIG. 7B, flow opening 208 fluidly connects to flow passages 242 on the outer surface 243 of plate 78. Passages 242 extend along the feed strip portion 200 of plate 78, and outward along the head portion 202. Opening 210 fluidly connects to flow passages 244 which also extend along the feed strip portion 200 and then outward along the head portion 202. Opening 212 is fluidly connected to passages 246 which also extend along the feed strip portion 200, and then outward along the head portion 202. Openings 222–224 and 225–227 are in fluid communication with the outer ends of passages 242, 244 and 246, respectively.

Figure 8A:
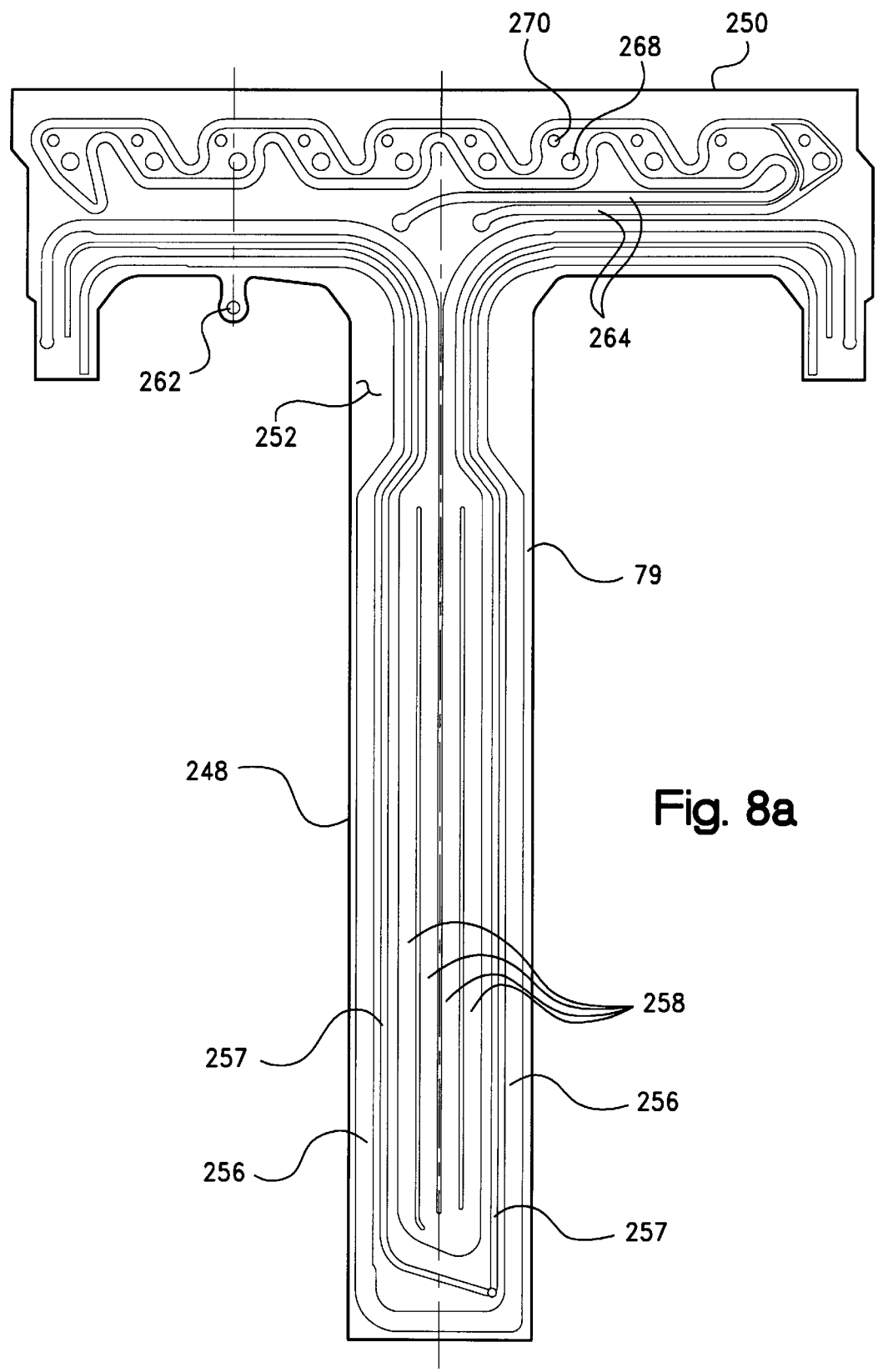
FIG. 8A is a plan view of the inner surface of a fourth plate for the unit of FIG. 4.
Figure 8B:
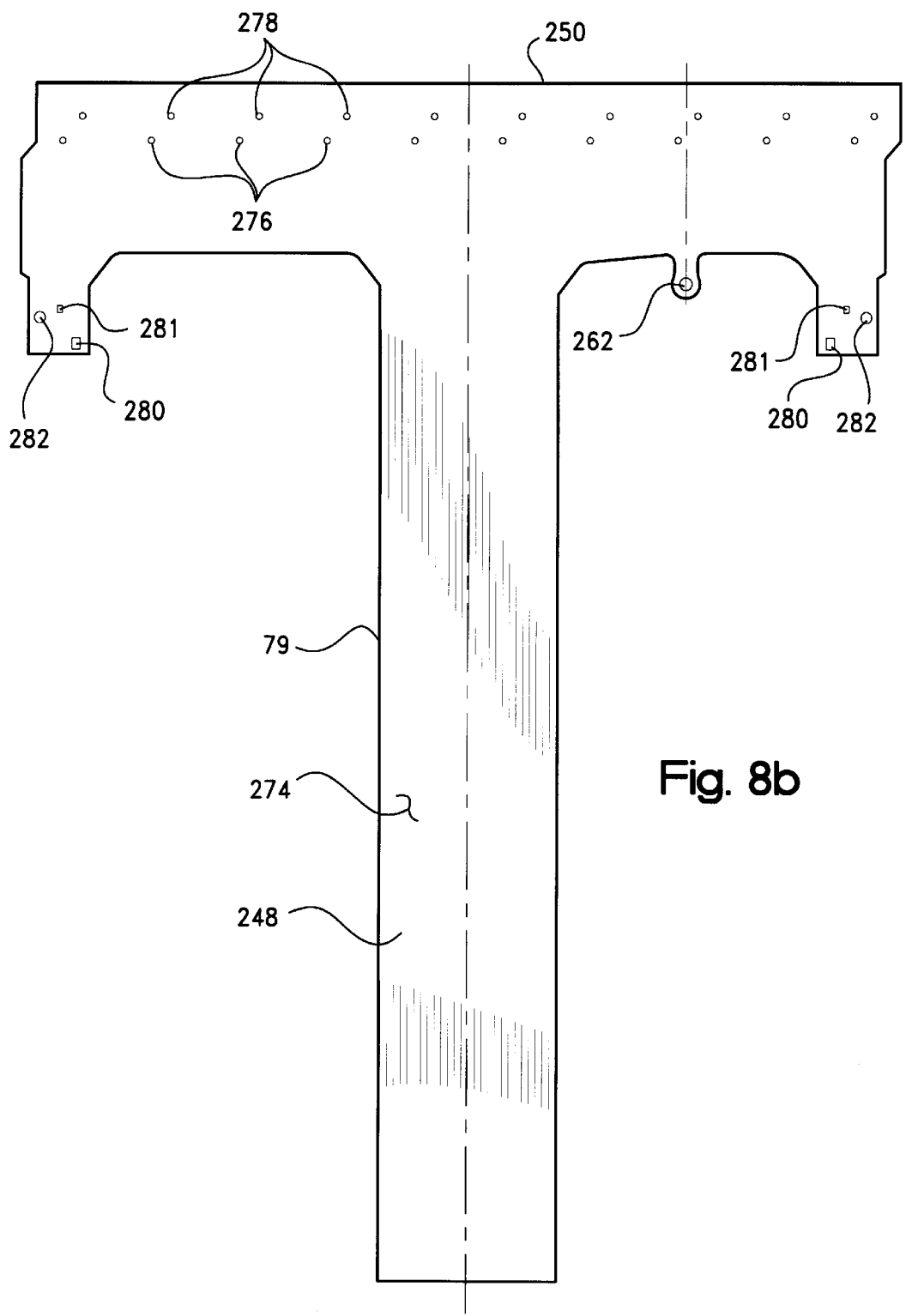
FIG. 8B is a plan view of the outer surface of the plate of FIG. 7A.

Referring now to FIGS. 8A and 8B, plate 79 also has a similar configuration in plan view with a longitudinally-extending feed strip portion 248 and a head (nozzle) portion 250, extending substantially perpendicular to the feed strip portion 248. The inner surface 252 of plate 79 is in surface-to-surface contact with surface 243 of plate 78. Surface 252 of plate 79 includes flow passages 256–258 which are in fluid alignment with passages 242, 244 and 246 in plate 78. Opening 262 in head portion 250 of plate 79 is in fluid communication with opening 229 in plate 78. Passages 264 in head portion 250 are in fluid communication with openings 220 in plate 78. Circular openings such as 268 and 270 are in fluid communication with openings such as at 232 and 234, respectively, in plate 78. Fluid passages 264 surround openings 268, 269 in a circuitous manner for cooling purposes. Passages 132 (which feed passages 264) also cool the feed strip portion of the unit. The outer surface 274 of plate 79 (FIG. 7B) includes discharge orifices such as at 276, 278, for openings 268, 270, respectively. The number (and location) of discharge orifices 276, 278 can vary depending upon the particular application. Outlet openings 280–282 are provided in fluid communication with fluid passages 256–258, respectively.

As should be appreciated, when plates 76–79 are disposed in surface-to-surface contact with each other, as described above, the flow openings and passages between the plates direct fuel from the inlet opening 84 (FIG. 5A) through fuel paths 283 (FIG. 11) formed by passages 100, 101 in plate 76 and passages 128, 129 in plate 77, to spray discharge orifices such as at 276 (FIG. 8B); and from inlet opening 86 (FIG. 5A) through fuel paths 284 (FIG. 11) formed by passages 94 and 96 in plate 76 and passages 124, 126 in plate 77, to spray discharge orifices such as at 278 (FIG. 8B) to the first and second fuel circuits in nozzle assembly 36. Fuel is also directed through fuel paths 285 (FIG. 11) formed by passages 242 in plate 78 and passages 256 in plate 79 to opening 280; and through fuel paths 286 (FIG. 11) formed by passages 246 in plate 78 and passages 258 in plate 79 to opening 282, to the first and second fuel circuits in nozzle assembly 37. Inlet opening 88 (FIG. 5A) directs fuel in a fuel path 287 (FIG. 11) formed by passages 108 in plate 76 and passages 132 in plate 77 to pilot outlet 262 (FIG. 8B) in nozzle assembly 36; while inlet opening 89 (FIG. 5A) directs fuel in a separate fuel path 288 (FIG. 11) formed by passages 244 in plate 78 and passages 257 in plate 79 to pilot outlet 281 (FIG. 8B), in the other nozzle assembly 37.

While the secondary nozzles in nozzle assemblies 36, 37 are described as being in series, that is, where the first circuit spray orifices 278 in nozzle assemblies 36 and 37 both receive fuel from inlet port 47, and second circuit spray orifices 276 in nozzle assemblies 36 and 37 both receive fuel from inlet port 48, these orifices could also be separately connected to separate inlet ports so that the circuits are separately controlled between the nozzle assemblies. This could be simply provided with additional openings and passages along the plates.

The flow passages, openings and various components of the spray devices in plates 76–79 can be formed in any appropriate manner, and it is preferred that they be formed by etching, such as chemical etching. The chemical etching of such plates should be known to those skilled in the art, and is described for example in Simmons, U.S. Pat. No. 5,435,884, which is hereby incorporated by reference. The etching of the plates allows the forming of very fine, well-defined and complex openings and passages, which allow multiple fuel circuits to be provided in the feed strip 64 and nozzle 59 while maintaining a small cross-section for these components. As should be appreciated from the Simmons patent, the hydraulically-natural shape of the swirl chambers, and of the feed passages into the swirl chambers and the discharge orifices form the swirl chambers, provide improved atomized sprays from the nozzles.

The plates 76–79 can be fixed together in an appropriate manner and it is preferred that the plates are fixed together in surface-to-surface contact with a bonding process such as brazing or diffusion bonding. Such bonding processes are well-know to those skilled in the art, and provide a very secure connection between the various plates. Diffusion bonding is particularly useful, as it causes boundary crossover (atom interchange) between the adjacent layers. Diffusion bonding is provided through appropriate applications of heat and pressure, typically under an applied vacuum in an inert atmosphere. A more detailed discussion of diffusion bonding can be found, for example, in U.S. Pat. No. 5,484,977; U.S. Pat. No. 5,479,705; and U.S. Pat. No. 5,038,857, among others.

After the plates 76–79 are bonded together, the head portions of all the plates can be mechanically formed (bent) into an appropriate configuration, if necessary. As shown in FIG. 4, the head portions are illustrated as being formed into a cylindrical configuration. This can be accomplished using appropriate equipment, for example, a cylindrical mandrel or other appropriately-shaped tool. The bonding process (such as brazing or diffusion bonding) maintains the various plates in fixed relation with respect to one another during this forming step. The radially-outer distal ends of the plates (for example, radially-outer ends 290, 291 in FIG. 5A) can then be joined together by an appropriated process such as brazing or welding to form a continuously cylindrical nozzle, or the ends of the plates could be spaced apart from each other. The plates could also be formed into shapes other than cylindrical, or even provided without forming, in appropriate applications.

As should be appreciated, spray orifices such as at 276, 278 are provided around the radially-outer surface of the nozzle 59 in the illustrated embodiment to provide sprays of fuel radially-outward from the nozzle. However, by appropriate routing of the fuel passages between the plates, the spray orifices could likewise be formed in the radially-inner surface to direct fuel radially inward into the nozzle. It is likewise possible that the spray orifices could be formed at the axial downstream end of the nozzle 59, if desirable. In fact, the nozzle could essentially be incorporated into the stem portion by forming orifices at the downstream end of the stem portion. The orifices could also be configured to direct the sprays in other than radial or axial directions, if necessary or desirable for a particular application.

As apparent in FIG. 4, an outlet flange 293 is formed by the multi-plate structure for connection to the pilot nozzle 58. Outlet flange 293 includes opening 262 in plate 79 (FIG. 8B), to direct fuel to the pilot nozzle in nozzle assembly 36. Likewise an outlet flange 295 is formed for connection to nozzle assembly 37. Outlet flange 295 includes openings 280–282 (FIG. 8B) to direct fuel to the pilot and secondary nozzles in nozzle assembly 37.

As shown in FIG. 4, feed strip 64 has a series of lateral convolutions along the longitudinal length of the strip. The convolutions can be formed by conventional mechanical forming methods, such as placing the feed strip between the two surfaces of a convoluted die. Most if not all of the convolutions can be formed in the feed strip before the stem is assembled with the feed strip, although it may be necessary to form one or more convolutions during later assembly steps, in order that the stem 32 can be fitted over the feed strip. As indicated previously, it is preferred that at least one convolution be formed in the feed strip 64, but it is more preferred that a plurality of convolutions be formed. Again, the convolutions allow axial expansion of the feed strip during the extreme operating conditions found in most combustion engines, and thereby reduce the mechanical stresses on the other components of the injector.

Appropriate heat shielding is provided for the nozzle assemblies 36, 37 of the injector. For example, referring now to FIG. 9, first and second cylindrical outer heat shields 300, 301 are received around the outer diameter of the nozzle portion 59. Heat shields 300, 301 each include a plurality of openings 302 aligned with spray orifices 276 (FIG. 8B); and a plurality of openings 304 aligned with spray discharge orifice 278 (FIG. 8B). Heat shields 300, 301 can be fixed to stem 32 in an appropriate manner, such as by welding or brazing. An air gap as at 305 is provided between the first shield 300 and the second heat shield 301. While not shown, inner heat shields can also be provided closely bounding the radially-inner surface of nozzle portion 59. The inner and outer heat shields are preferably conventional in design, as should be appreciated by those skilled in the art.

The pilot nozzle 58 is also connected to nozzle 59, and includes an inlet fuel tube 314 with an inner passage 316 which is fluidly connected to passage 262 (FIG. 8B) in plate 79 to receive fuel from the pilot flow circuit in the nozzle. Tube 314 is attached to flange 293 (FIG. 4) of nozzle 59 such as by brazing or welding. For purposes of clear understanding, pilot nozzle 58 is shown rotated 900 from its actual location. As can be seen in FIG. 4, attachment flange 293 is actually along the side of nozzle 59.

A cylindrical heat shield 318 surrounds tube 314, and includes an air gap 320 for cooling purposes. Heat shield 318 is attached to stem 32 in an appropriate manner. Pilot nozzle 58 can be any appropriate nozzle configuration, and preferably includes an outer shroud 322 integral (in one piece) with heat shield 318, and any other appropriate heat shield layers. While pilot nozzle 58 is illustrated as a simple jet spray nozzle, the pilot nozzle can have any configuration as necessary, to provide fuel in a stream or spray (such as a swirling spray). A plug 336 is then connected to the upstream end of shroud 322 after the pilot nozzle is properly connected and positioned.

After stem 32 is connected to heat shields 300, 301, any final convolution(s) in the feed strip can then be formed. The support flange 30 can then be attached to stem 32, such as by brazing or welding or other appropriate attachment technique, and inlet assembly 41 can be fitted into the support flange 30, and attached thereto. Inlet assembly 41 is also attached to feed strip 64 (such as by brazing or welding) to provide a fluid-tight structure, with the inlet ports 4649 in inlet assembly 41 in fluid alignment with the inlet openings 84, 86, 88, 89, respectively, in the feed strip. As should be appreciated, the fixed attachment between the feed strip 64 and the inlet assembly 41, and between the feed strip and nozzle 59, is provided without seals (such as elastomer seals) or sliding components. This reduces the chance of leak paths, and provides a dry tertiary chamber 39. This is useful as fuel is thereby prevented from entering the chamber and coking over time.

Figure 12:
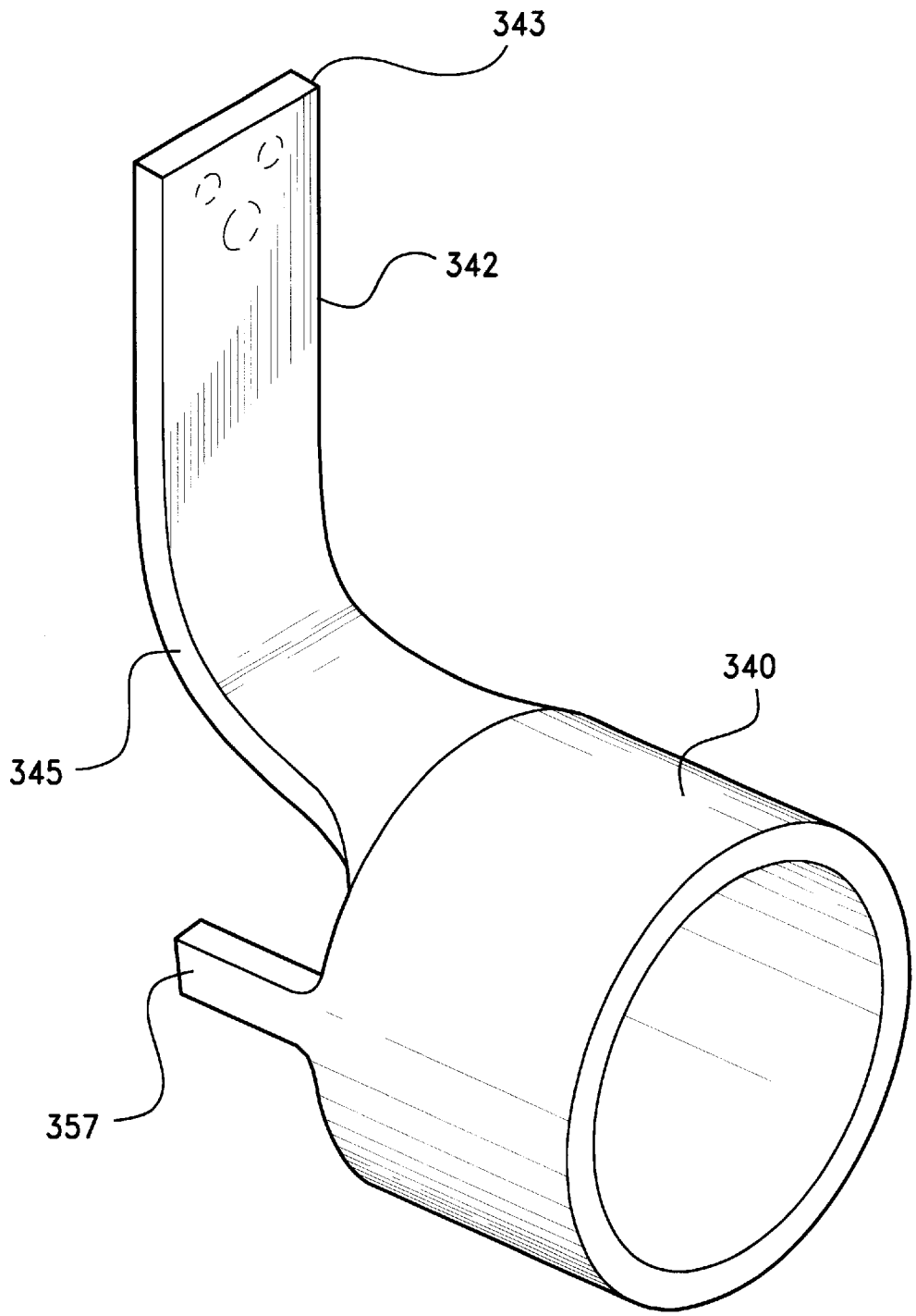
FIG. 12 is an elevated perspective view of a second integral fuel feed strip and nozzle unit for the fuel injector of FIG. 2.

The second nozzle assembly 37 can then be attached to the first nozzle assembly 36. As shown in FIG. 12, the second nozzle assembly 37 also includes a secondary nozzle 340 with a unitary feed strip 342. Feed strip 342 includes an inlet end 343 which is fluidly connected to an inlet assembly, indicated generally at 346 in FIG. 3, which itself is fluidly connected to the outlet openings 280–282 (FIG. 8B) in plate 79. Inlet assembly 346, like inlet assembly 41, includes inlet ports to fluidly connect the outlet openings of nozzle assembly 37 with the inlet openings in feed strip 342.

Feed strip 342 and second nozzle 340 of nozzle assembly 37 are preferably formed in a similar manner as feed strip 64 and secondary nozzle 59 of nozzle assembly 36. The flow passages through feed strip 64 and secondary nozzle 59 of nozzle assembly 37 are essentially the same (except that only one pilot fuel circuit is provided), and will not be described in detail. Feed strip 342 includes a generally right-angle bend 345 in its connection with nozzle 344, which serves to absorb mechanical stresses in the nozzle assembly 37 due to thermal cycling. Multiple convolutions are generally not necessary in feed strip 342, as this feed strip is shorter than feed strip 64, and because of space constraints, although multiple convolutions can certainly be provided in appropriate applications.

Nozzle 37 is supported with respect to nozzle 36 by first and second stem portions 348, 350 which are connected together by an appropriate method, such as by brazing or welding. Appropriate inner and outer heat shields can be provided for nozzle 340, as described above with respect to nozzle 59, and also will not be described for sake of brevity. A pilot nozzle, generally indicated at 356, is also supported within nozzle assembly 37. Pilot nozzle 356 is also preferably the same as the pilot nozzle 58 in nozzle assembly 36, and also will not be described. Pilot nozzle 356 is fluidly connected to outlet flange 357 in secondary nozzle 340, in the same manner as described with respect to pilot nozzle 58.

As should be appreciated, air at elevated temperatures is provided around the nozzles. When fuel passes through the pilot nozzle 58, the fuel leaves the nozzle, and is impacted by the air. The fuel/air mixture then passes out through the nozzle for burning in the combustion chamber.

The secondary nozzle 59, as described above, provides a radially outward directed spray through either (or both) sets of spray orifices 276, 278 (FIG. 8B), depending upon whether fuel is provided to either or both of the fuel circuits. The outward-directed spray is impacted by and directed downstream by air within the combustion chamber and is then ignited. The fuel in passages 264 assist in cooling the nozzle area surrounding openings 268, 269; while the fuel in passages 132 (as well as the other passages in the stem) assist in cooling the feed strip portion of the injector.

Again, while a dual nozzle configuration is shown, such a structure is only for exemplary purposes, and it is possible that only a single nozzle assembly can be provided in an annular configuration (or otherwise) for each injector; and each nozzle can have only a single nozzle, rather than separate pilot and secondary nozzles. Likewise, while a radially outer spray from the secondary nozzle is shown, the spray can likewise be radially inner, or even axially from the end of the nozzle.

Thus, as described above, the present invention provides a novel and unique fuel injector nozzle for a combustion engine, and particularly a gas turbine combustion engine, which can include multiple fuel circuits, single or multiple nozzle assemblies, and cooling circuits. The injector overall has few components for weight reduction and thereby increased fuel efficiency. The fuel injector fits within a small envelope and is economical to manufacture and assemble.

The principles, preferred embodiments and modes of operation of the present invention have been described in the foregoing specification. The invention which is intended to be protected herein should not, however, be construed as limited to the particular form described as it is to be regarded as illustrative rather than restrictive. Variations and changes may be made by those skilled in the art without departing from the scope and spirit of the invention as set forth in the appended claims.

What is claimed is:

1. A fuel injector nozzle, comprising:
   an elongated, essentially flat feed strip in cross-section, the feed strip having an internal fuel passage through the length of the strip from an inlet end to an outlet end; and
   a fuel dispensing nozzle at the outlet end of the feed strip fluidly connected to the internal fuel passage to dispense the fuel.

2. The fuel injector nozzle as in claim 1, wherein the feed strip absorbs is integrally attached to the fuel dispensing nozzle.

3. The fuel injector nozzle as in claim 2, wherein the feed strip includes at least one convolution along the length of the strip.

4. The fuel injector nozzle as in claim 3, wherein the feed strip includes a plurality of lateral convolutions.

5. The fuel injector as in claim 1, wherein the fuel strip is integrally attached to the fuel dispensing nozzle.

6. The fuel injector nozzle as in claim 5, wherein the feed strip and fuel dispensing nozzle are unitary with one another.

7. The fuel injector nozzle as in claim 6, wherein the feed strip is integrally attached to the fuel dispensing nozzle.

8. The fuel injector nozzle as in claim 1, wherein the feed strip comprises a multi-layered arrangement of plates.

9. The fuel injector nozzle as in claim 8, wherein the plates each include a section of a flow path forming the internal fuel passage.

10. The fuel injector nozzle as in claim 9, wherein the feed strip absorbs stresses resulting from thermal differences along the length of the strip.

11. The fuel injector nozzle as in claim 10, wherein the feed strip includes at least one convolution along the length of the strip.

12. The fuel injector nozzle in claim 11, wherein the feed strip includes a plurality of lateral convolutions.

13. The fuel injector nozzle as in claim 9, wherein the feed strip is integrally attached to the fuel dispensing nozzle.

14. The fuel injector as in claim 13, wherein the feed strip and fuel dispensing nozzle are unitary with one another.

15. The fuel injector nozzle as in claim 14, further including a support stem surrounding the feed strip and fixedly connected to the nozzle for support of the nozzle.

16. A fuel injector nozzle, comprising:
a feed strip having an internal fuel passage through the length of the strip from an inlet end to an outlet end; and
a fuel dispensing nozzle at the outlet end of the feed strip fluidly connected to the internal fuel passage to dispense the fuel, wherein the fuel injector nozzle includes a multi-layered arrangement of plates.

17. The fuel injector nozzle as in claim 16, wherein the plates each include a section of a flow path forming the internal flow passage in the fuel injector nozzle.

18. The fuel injector nozzle as in claim 17, wherein the fuel dispensing nozzle includes multiple spray orifices and internal flow passages fluidly connecting the internal flow passage in the feed strip to the spray orifices.

19. The fuel injector nozzle as in claim 18, wherein the fuel dispensing nozzle has a cylindrical configuration.

20. A fuel injector nozzle, comprising:
a feed strip having an internal fuel passage through the length of the strip from an inlet end to an outlet end;
a fuel dispensing nozzle at the outlet end of the feed strip fluidly connected to the internal fuel passage to dispense the fuel; and
further including a pilot nozzle disposed centrally within the fuel dispensing nozzle, the feed strip including another internal fuel passage through the length of the strip from an inlet end to an outlet end, and the pilot nozzle is fluidly connected to the other internal fuel passage to dispense fuel.

21. A fuel injector nozzle for dispensing fuel into a combustion chamber of a gas turbine combustion engine, said fuel injector nozzle comprising:
an elongated, multi-layered feed strip having an internal fuel passage for directing fuel through the length of the strip from an inlet end to an outlet end; and
a cylindrical multi-layered fuel dispensing nozzle unitary with the feed strip and fluidly connected to the internal fuel passage to dispense the fuel.

22. The fuel injector nozzle as in claim 21, wherein the feed strip absorbs stresses resulting from thermal differences along the length of the strip.

23. The fuel injector nozzle as in claim 22, wherein the feed strip includes at least one convolution along the length of the strip.

24. The fuel injector nozzle as in claim 23, wherein the feed strip includes a plurality of lateral convolutions.

25. The fuel injector nozzle as in claim 21, further including a support stem surrounding the feed strip and fixedly connected to the fuel dispensing nozzle for support of the fuel dispensing nozzle.

26. The fuel injector nozzle as in claim 21, wherein the plates each include a section of a flow path forming the internal fuel passage.

27. The fuel injector nozzle as in claim 21, wherein the fuel dispensing nozzle includes a plurality of spray orifices and internal flow passages fluidly connecting the internal flow passage in the feed strip to the spray orifices.

28. The fuel injector nozzle as in claim 21, further including a pilot nozzle disposed centrally within the fuel dispensing nozzle, the feed strip including another internal fuel passage through the length of the strip from an inlet end to an outlet end, and the pilot nozzle is fluidly connected to the other internal fuel passage to dispense fuel.

29. The fuel injector nozzle as in claim 21, wherein the fuel dispensing nozzle is formed by bending a flat, multi-layered plate assembly into a cylindrical configuration.

30. The fuel injector nozzle as in claim 21, wherein the cylindrical fuel dispensing nozzle is circumferentially-continuous.

31. A combustion engine including a fuel injector nozzle as in claim 21, and a combustion chamber, the fuel injector nozzle supported in the combustion chamber to dispense fuel within the chamber.

32. A method for forming a fuel injector nozzle, comprising the steps of:
providing a plurality of flat plates, each of the plates having generally a T-shape in plan view with a feed strip portion and a nozzle portion, the nozzle portion of the plates being unitary with and substantially perpendicular to the feed strip portion of the plates;
etching fuel passages in the plates such that the plates, when layered together in adjacent, surface-to-surface relation with each other, define an internal fuel passage from an inlet end in the feed strip portion to a spray orifice in the nozzle portion;
bonding the plates together in adjacent, surface-to-surface contact with one another; and
bending the nozzle portion to form a cylindrical nozzle, with the spray orifice dispensing fuel in a radial direction.

33. The method as in claim 32, wherein the nozzle portion is bent to form a continuous cylinder, with the ends of the cylindrical nozzle being fixed together.

34. The method as in claim 32, further including forming at least one convolution in the feed strip.

35. The fuel injector nozzle as in claim 16, wherein the feed strip includes a multi-layered arrangement of plates.

36. The fuel injector as in claim 16, wherein the fuel dispensing nozzle includes a multi-layered arrangement of plates.

37. The fuel injector as in claim 18, wherein the feed strip includes multiple internal fuel passages fluidly connected to the internal flow passages in the fuel dispensing nozzle.

38. The method as in claim 32, further including the step of etching the spray orifice in the nozzle portion.

* * * * *

UNITED STATES PATENT AND TRADEMARK OFFICE
CERTIFICATE OF CORRECTION

PATENT NO. : 6,321,541 B1
DATED : November 27, 2001
INVENTOR(S) : Michael R. Wrubel et al.

It is certified that error appears in the above-identified patent and that said Letters Patent is hereby corrected as shown below:

<u>Column 13,</u>
Lines 1, 4, 6, 18, 21, 24 and 29, delete entire claim.

<u>Column 14,</u>
Lines 1, 4, 7, 28, 52 and 55, delete entire claim.

Signed and Sealed this

Second Day of September, 2003

JAMES E. ROGAN
*Director of the United States Patent and Trademark Office*